United States Patent
Choi et al.

(10) Patent No.: US 7,649,192 B2
(45) Date of Patent: *Jan. 19, 2010

(54) NANO WIRES AND METHOD OF MANUFACTURING THE SAME

(75) Inventors: Byoung-lyong Choi, Seoul (KR); Eun-kyung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 412 days.

This patent is subject to a terminal disclaimer.

(21) Appl. No.: 11/369,859

(22) Filed: Mar. 8, 2006

(65) Prior Publication Data

US 2006/0212975 A1 Sep. 21, 2006

(30) Foreign Application Priority Data

Mar. 9, 2005 (KR) .................... 10-2005-0019579

(51) Int. Cl.
 *H01L 29/06* (2006.01)
(52) U.S. Cl. .............................. 257/9; 257/10; 257/22; 257/43; 977/721; 977/768; 977/789; 977/938; 977/810; 977/762
(58) Field of Classification Search .............. 977/721, 977/768, 789, 938, 810, 762; 257/9, 10, 257/22, 43
 See application file for complete search history.

(56) References Cited

U.S. PATENT DOCUMENTS

| 5,976,957 | A  | * | 11/1999 | Westwater et al. | 438/478 |
| 6,130,142 | A  | * | 10/2000 | Westwater et al. | 438/478 |
| 6,130,143 | A  | * | 10/2000 | Westwater et al. | 438/478 |
| 6,306,734 | B1 | * | 10/2001 | Givargizov | 438/478 |
| 6,359,288 | B1 | * | 3/2002 | Ying et al. | 257/14 |
| 6,773,943 | B2 | * | 8/2004 | Oohata et al. | 438/30 |
| 7,012,311 | B2 | * | 3/2006 | Ohmi et al. | 257/410 |
| 7,161,148 | B1 | * | 1/2007 | Givargizov et al. | 250/306 |
| 7,335,603 | B2 | * | 2/2008 | Mancevski | 438/758 |
| 7,344,961 | B2 | * | 3/2008 | Romano et al. | 438/478 |
| 7,351,607 | B2 | * | 4/2008 | Wang et al. | 438/99 |
| 7,501,315 | B2 | * | 3/2009 | Heald et al. | 438/128 |
| 2001/0023986 | A1 | * | 9/2001 | Mancevski | 257/741 |

(Continued)

FOREIGN PATENT DOCUMENTS

EP 0 838 865 A2 4/1998

(Continued)

OTHER PUBLICATIONS

Claims for Co-Pending U.S. Appl. No. 11/362,897.*

(Continued)

*Primary Examiner*—Robert M Kunemund
*Assistant Examiner*—G. Nagesh Rao
(74) *Attorney, Agent, or Firm*—Cantor Colburn LLP

(57) ABSTRACT

Provided are nano wires and a method of manufacturing the same. The method includes forming microgrooves having a plurality of microcavities, the microgrooves forming a regular pattern on a surface of a silicon substrate; forming a metal layer on the silicon substrate by depositing a material which acts as a catalyst to form nano wires on the silicon substrate; agglomerating the metal layer within the microgrooves on the surface of the silicon substrate by heating the metal layer to form catalysts; and growing the nano wires between the catalysts and the silicon substrate using a thermal process.

5 Claims, 5 Drawing Sheets

U.S. PATENT DOCUMENTS

| | | | |
|---|---|---|---|
| 2004/0028812 A1* | 2/2004 | Wessels et al. | 427/248.1 |
| 2005/0233560 A1* | 10/2005 | Akinaga et al. | 438/584 |
| 2005/0253138 A1* | 11/2005 | Choi et al. | 257/40 |
| 2006/0009003 A1* | 1/2006 | Romano et al. | 438/382 |
| 2006/0212975 A1* | 9/2006 | Choi et al. | 977/810 |
| 2006/0257637 A1* | 11/2006 | Pereira et al. | 428/221 |
| 2006/0258132 A1* | 11/2006 | Brown et al. | 438/610 |
| 2007/0003472 A1* | 1/2007 | Tolt | 423/447.3 |
| 2007/0297216 A1* | 12/2007 | Tour et al. | 365/151 |
| 2008/0023693 A1* | 1/2008 | Dubrow et al. | 257/24 |
| 2008/0088899 A1* | 4/2008 | Kamins et al. | 359/196 |
| 2008/0093698 A1* | 4/2008 | Tsakalakos et al. | 257/499 |
| 2009/0152527 A1* | 6/2009 | Lee et al. | 257/9 |

FOREIGN PATENT DOCUMENTS

| | | |
|---|---|---|
| JP | 10-135444 | 5/1998 |
| JP | 2004-122283 | 4/2004 |

OTHER PUBLICATIONS

European Search Report dated Jun. 1, 2006.

* cited by examiner

0sccm Chlorine 80 sccm Chlorine 160 sccm Chlorine

240sccm Chlorine

US 7,649,192 B2

NANO WIRES AND METHOD OF MANUFACTURING THE SAME

BACKGROUND OF THE DISCLOSURE

Priority is claimed to Korean Patent Application No. 10-2005-0019579, filed on Mar. 9, 2005 in the Korean Intellectual Property Office, the disclosure of which is incorporated herein in its entirety by reference.

1. Field of the Disclosure

The present disclosure relates to nano wires and a method of manufacturing the same, and more particularly, to silicon nano wires made by accurately controlling the size and distribution of nucleation regions for forming the nano wires when forming silicon nano wires, and a method of manufacturing the same.

2. Description of the Related Art

Nano wires are currently being widely researched, and are a next-generation technology used in various devices such as optical devices, transistors, and memory devices. Materials used in nano wires include silicon, zinc oxide, and gallium nitride, which is a light emitting semiconductor. The nano wire manufacturing technique is sufficiently developed to be used for altering of the length and width of nano wires.

Quantum dots or nano light emitting devices using quantum dots are used in conventional nano light emitting (EL) devices. Organic EL devices using quantum dots have high radiative recombination efficiency but low carrier injection efficiency. GaN LEDs, which use quantum wells, have relatively high radiative recombination efficiency and carrier injection efficiency. However, it is very difficult to produce GaN LED on a large area due to a defect caused by the difference in the crystallization structures of the GaN LED and a commonly used sapphire substrate, and thus the manufacturing costs of GaN LEDs are relatively high. A nano light emitting device using nano wires has very high radiative recombination efficiency and relatively high carrier injection efficiency. In addition, the manufacturing process of a nano light emitting device is simple and a nano light emitting device can be formed to have a crystallization structure that is practically similar to that of a substrate, and thus it is easy to form the nano light emitting device in a large area.

FIGS. 1A through 1D are cross-sectional views illustrating a vapor-liquid-solid (VLS) method, which is a conventional method of manufacturing nano wires.

Referring to FIG. 1A, first, a substrate 11 is provided. The substrate 11 may be a commonly used silicon substrate.

Thereafter, referring to FIG. 1B, a metal layer 12 is formed on top of the substrate 11 by spreading a metal such as Au.

Then, referring to FIG. 1C, the resultant structure is thermally processed at approximately 500° C. As a result, materials in the metal layer 12 are agglomerated, thereby forming catalysts 13. The sizes of the catalysts 13 are irregular.

After forming the catalysts 13, nano wires 14 are formed where the catalysts 13 are formed using the catalysts 13 as nucleation regions, as illustrated in FIG. 1D. The nano wires 14 are formed by supplying, for example, silane ($SiH_4$), which is a compound of silicon and hydrogen, to the catalysts 13 to induce nucleation of Si of silane at the locations where the catalysts 13 are formed. When supplying the silane, the nano wires 14 can continuously grow from the bottom of the catalysts 13, as illustrated in FIG. 1D.

As described above, nano wires with desired lengths can be easily formed by appropriately controlling the amount of supplied material gas such as silane. However, the growth of nano wires can be limited by the diameters and distribution of the catalysts, and thus it is difficult to accurately control the thicknesses and distribution of nano wires.

SUMMARY OF THE DISCLOSURE

The present disclosure provides a method of manufacturing nano wires which are grown by controlling diameters and distribution of nano wires, and nano wires accurately grown using the method.

The present disclosure also provides nano wires having a PN junction structure, and a method of manufacturing the same.

According to an aspect of the present disclosure, there is provided a method of manufacturing nano wires, the method comprising: forming microgrooves having a plurality of microcavities, the microgrooves forming a regular pattern on a surface of a silicon substrate; forming a metal layer on the silicon substrate by depositing a material which acts as a catalyst to form nano wires on the silicon substrate; agglomerating the metal layer within the microgrooves on the surface of the silicon substrate by heating the metal layer to form catalysts; and growing the nano wires between the catalysts and the silicon substrate using a thermal process.

The forming of the microgrooves may comprise: forming the microgrooves by oxidizing a surface of the silicon substrate to form a silicon oxide layer; and exposing the microgrooves by removing the silicon oxide layer.

The forming of the metal layer may comprise coating at least one transition metal.

The metal layer may comprise at least one transition metal selected from the group consisting of Au, Ni, Ti, or Fe.

The growing of the nano wires may comprise forming the nano wires between the catalysts and the silicon substrate by controlling the temperature and tmospheric pressure at which the thermal process is performed.

The thermal process may be performed at a temperature higher than a eutectic temperature of the catalysts and the silicon substrate.

The method may further comprise forming an oxide layer on sides of the nano wires by performing an oxidation process after forming the nano wires.

According to another aspect of the present disclosure, there is provided a nano wire structure comprising: a substrate having a surface where microgrooves having a plurality of microcavities are formed; nano wires formed on the substrate from each of the microgrooves; and a metal catalyst formed on one end of each of the nano wires.

The microgrooves having the microcavities may be formed in a regular arrangement and distribution in the silicon substrate.

The nano wires may further comprise oxide layers formed on sides of the nano wires.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE DISCLOSURE

Figure 1A:
FIGS. 1A through 1D are cross-sectional views illustrating a conventional method of manufacturing nano wires.
Figure 1B:
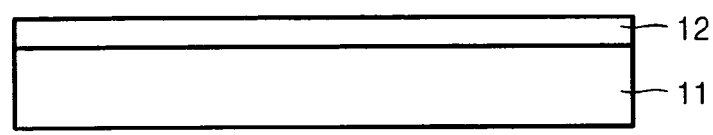
Figure 1C:
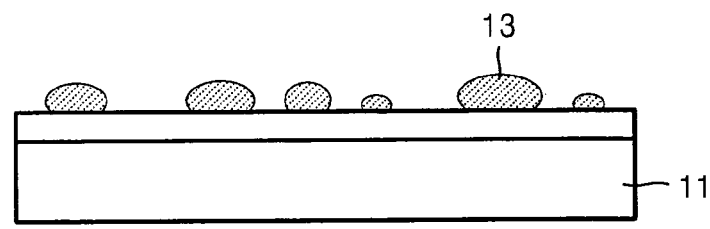
Figure 1D:
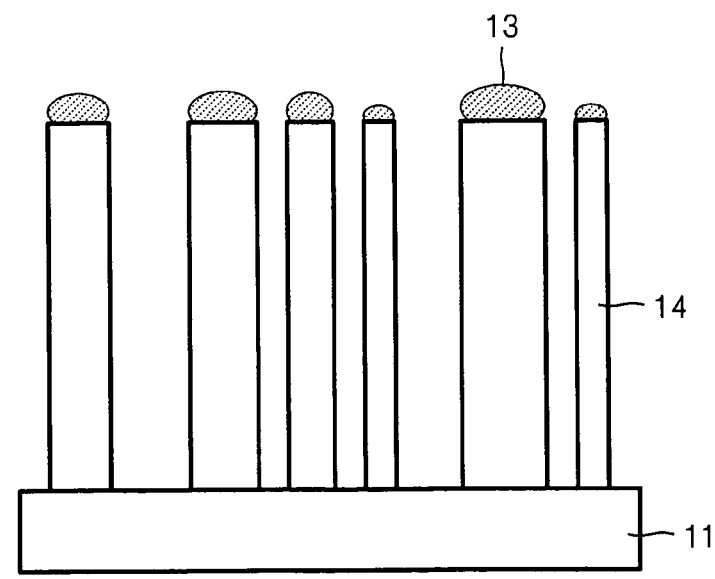

Nano wires and a method of manufacturing the same according to the present invention will now be described more fully with reference to the accompanying drawings, in which exemplary embodiments of the invention are shown. In the drawings, the lengths and sizes are exaggerated for clarity.

Figure 2:
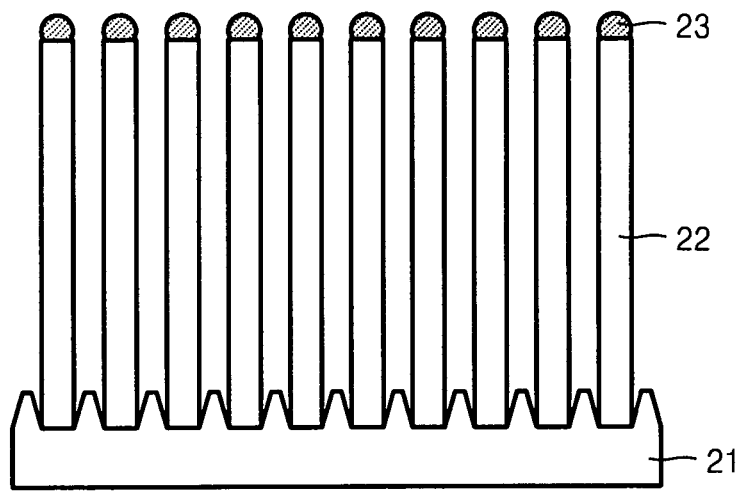
FIG. 2 is a cross-sectional view of nano wires according to an embodiment of the present disclosure.

FIG. 2 is a cross-sectional view of nano wires 22 according to an embodiment of the present disclosure. Referring to FIG. 2, microgrooves including a plurality of microcavities are formed in the surface of a substrate 21. The nano wires 22 grown in a vertical direction are formed in the microgrooves, and a catalyst 23 is formed on one end of each of the nano wires 22. The microgrooves formed in the surface of the substrate 21 are formed to a desired width, and the sizes and distribution of the nano wires 22 formed above the substrate 21 are determined according to the sizes and distribution of the microgrooves. A method of forming the microgrooves including the microcavities in the surface of the substrate 21 will be described below together with a method of manufacturing the nano wires 22.

FIGS. 3A through 3D are cross-sectional views illustrating a method of manufacturing nano wires according to an embodiment of the present disclosure.

Figure 3A:
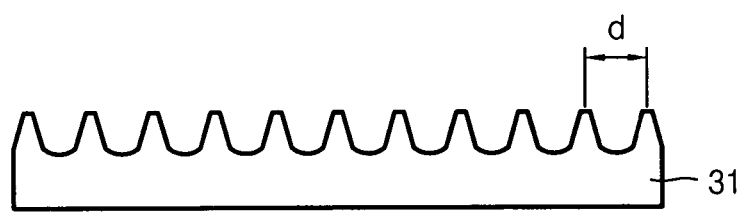
FIGS. 3A through 3D are cross-sectional views illustrating a method of manufacturing nano wires according to an embodiment of the present disclosure.

Referring to FIG. 3A, first, a substrate 31 having microgrooves in its surface is provided. The microgrooves having widths d are formed in the substrate 31. The microgrooves having the microcavities are formed as follows.

First, an oxidation process is performed on a surface of the silicon substrate 31 in which microgrooves having microcavities are to be formed to form a silicon oxide layer ($SiO_2$) (not shown) on the surface of the silicon substrate 31. The oxidation process is a dry oxidation process under an oxygen ($O_2$) and chlorine gas ($Cl_2$) atmosphere, and nitrogen gas ($N_2$) can be further added to control the pressure within a processing chamber. The dry oxidation process is performed at a high temperature of about 1150° C. for a long period of time (i.e., several to tens of minutes). The silicon oxide layer can be formed using a wet oxidation process. The pressure inside the process chamber is determined by oxygen and nitrogen gas, and chlorine gas may be added in a smaller ratio than oxygen.

Chlorine gas increases the oxidation rate during the oxidation process. That is, chlorine gas accelerates the reaction or diffusion of oxidants at an interface between the silicon oxide layer and the substrate 31 which is a silicon layer. In addition, chlorine gas traps and neutralizes contamination of sodium in the silicon oxide layer, and getters metallic impurities and prevents stacking faults from the silicon layer. Excess chlorine beyond the threshold concentration causes the formation of additional phases between the silicon oxide layer and the silicon layer due to the accumulation of gaseous oxidation products, thereby making the interface ($SiO_2$/Si) between the silicon oxide layer and the silicon layer rougher.

Since, chlorine causes the interface between the silicon oxide layer and the silicon layer of the substrate 31 to be rougher, microgrooves are formed, thereby enabling formation of a superior quality silicon oxide layer. Thereafter, when the silicon oxide layer on the surface of the substrate 31 is removed through an etching process, a microgroove structure including microcavities as illustrated in FIG. 3A is formed.

FIGS. 4A through 4D are AFM images of surfaces of substrates to which different amounts of chlorine gas is injected. FIGS. 4A through 4D respectively illustrate where 0, 80, 160, and 240 sccm of chlorine gas are injected into the process chamber. As the amount of injected chlorine gas increases, the surface gets rougher, thereby increasing the width d of the microgrooves.

Figure 4A:
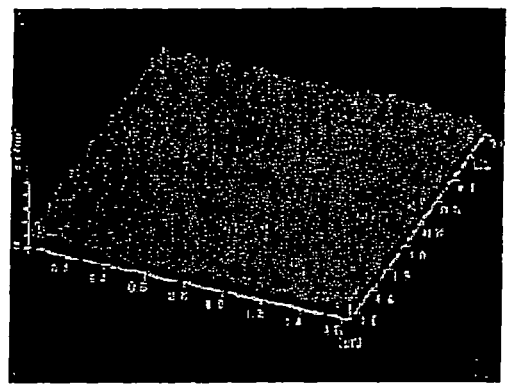
FIGS. 4A through 4D are AFM images of surfaces of substrates manufactured with a microsurface structure like the one illustrated in FIG. 3.
Figure 4B:
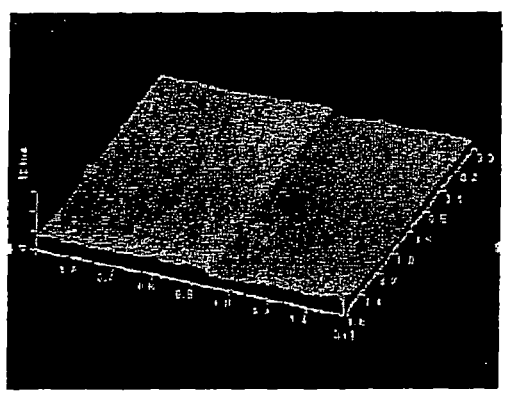
Figure 4C:
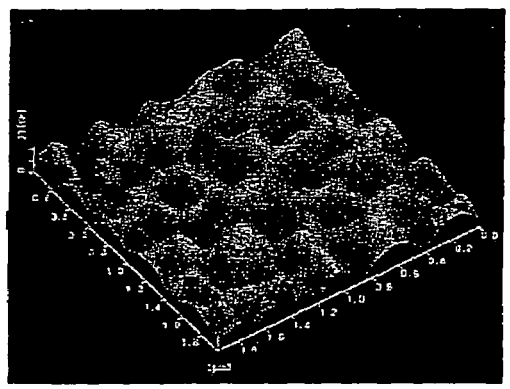
Figure 4D:
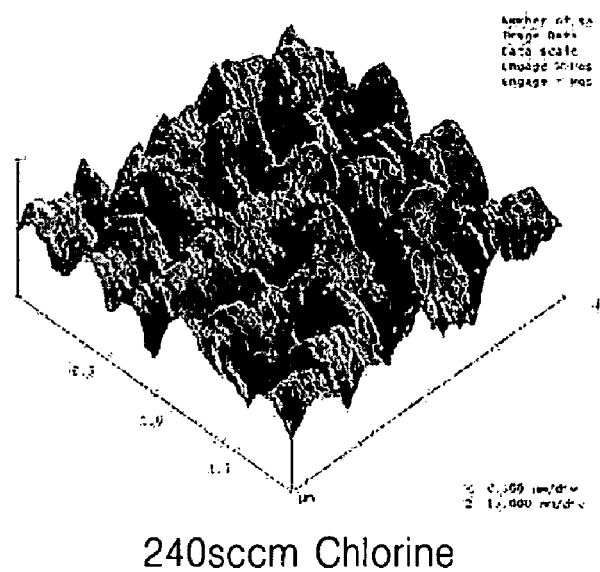
Figure 4E:
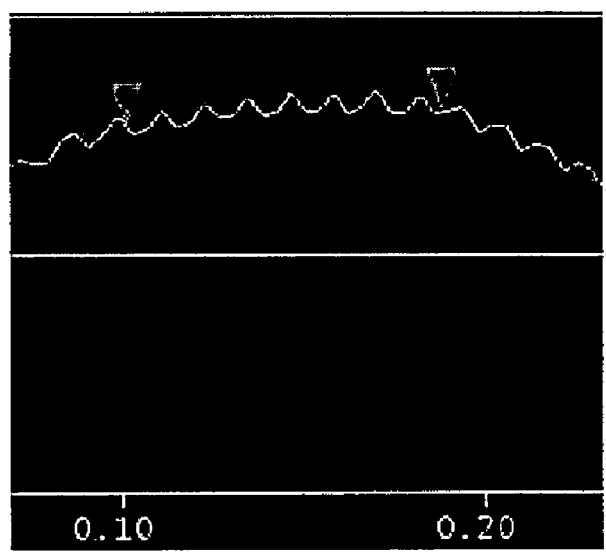
FIG. 4E is a graph illustrating surface illumination of a cross section of the substrate illustrated in FIG. 4D.

FIG. 4E is a graph illustrating surface illumination of a cross section of the substrate after being injected with 240 sccm of chlorine gas. The left and right sides of FIG. 4E are shown distorted, but it can be seen that a microgroove surface with relatively regular grooves and having an illumination of several nm is obtained. That is, microgrooves formed at intervals of several nm can have a microcavity structure.

Figure 3B:
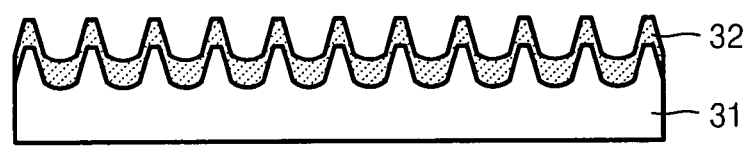

Referring to FIG. 3B, after forming the microgrooves having microcavities with a regular arrangement as described above, a metal layer 32 is formed on top of the substrate 31. The metal layer 32 is made of a material which can act as a catalyst to form nano wires that are to be grown. The material may be a transition metal such as Au, Ni, Ti, or Fe. The metal layer 32 is formed thinly to a thickness of several nm, and has microgrooves having microcavities with a relatively regular arrangement, just like the substrate 31, depending on the shape of the surface of the substrate 31 formed below the metal layer 32.

Figure 3C:
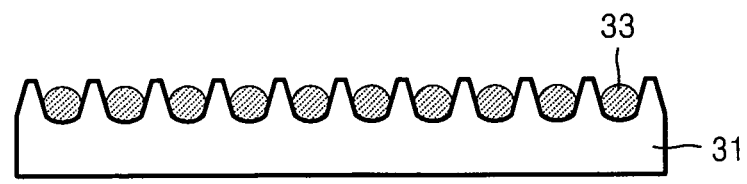

Next, referring to FIG. 3C, the metal layer 32 is heated to induce agglomeration of the metal layer 32. It is sufficient if the metal layer 32 is heated to about 500° C., as in the prior art. The material composing the metal layer 32 is agglomerated within the microgrooves on the surface of the substrate 31 due to the heat and forms catalysts 32 that are nano-sized. In other words, the microgrooves formed in the surface of the substrate 31 are used to control the locations at which the catalysts 33 are to be formed and the sizes of the catalysts 33. As a result, regions in which the catalysts 33 are formed are limited by the microgrooves and the sizes of the catalysts 33 can be controlled by the sizes of the microgrooves.

Figure 3D:
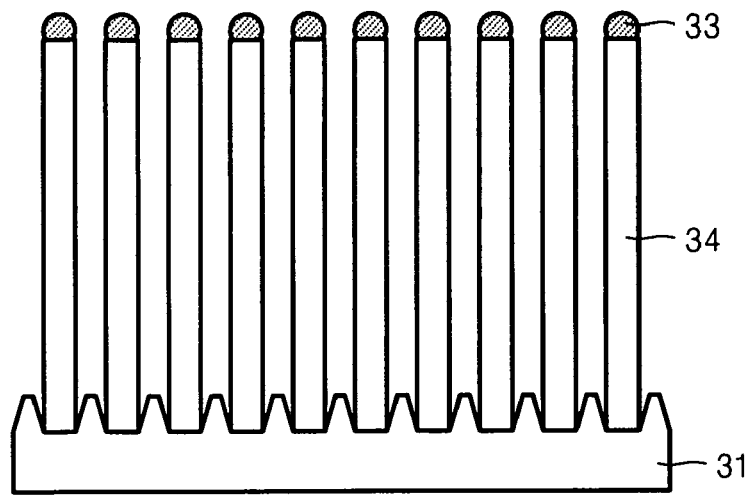

Thereafter, referring to FIG. 3D, nano wires 34 are formed where the catalysts 33, which act as nucleation regions, are formed. The nano wires 34 are formed by inducing nucleation of Si of the substrate 31 where the catalysts 33 are formed at a temperature higher than the eutectic temperature (about 363° C. in the case of Au). The nano wires 34 can grow to a desired length by controlling the temperature, the atmospheric pressure, and time. For example, the temperature can range from 500 to 1100° C., and the pressure can range from 100 Torr to normal atmospheric pressure.

Consequently, the thickness of the nano wires 34 can be controlled by forming microgrooves of a desired size with microcavities in the surface of the substrate 31, and the nano wires 34 can be grown with relatively uniform widths.

Figure 3E:
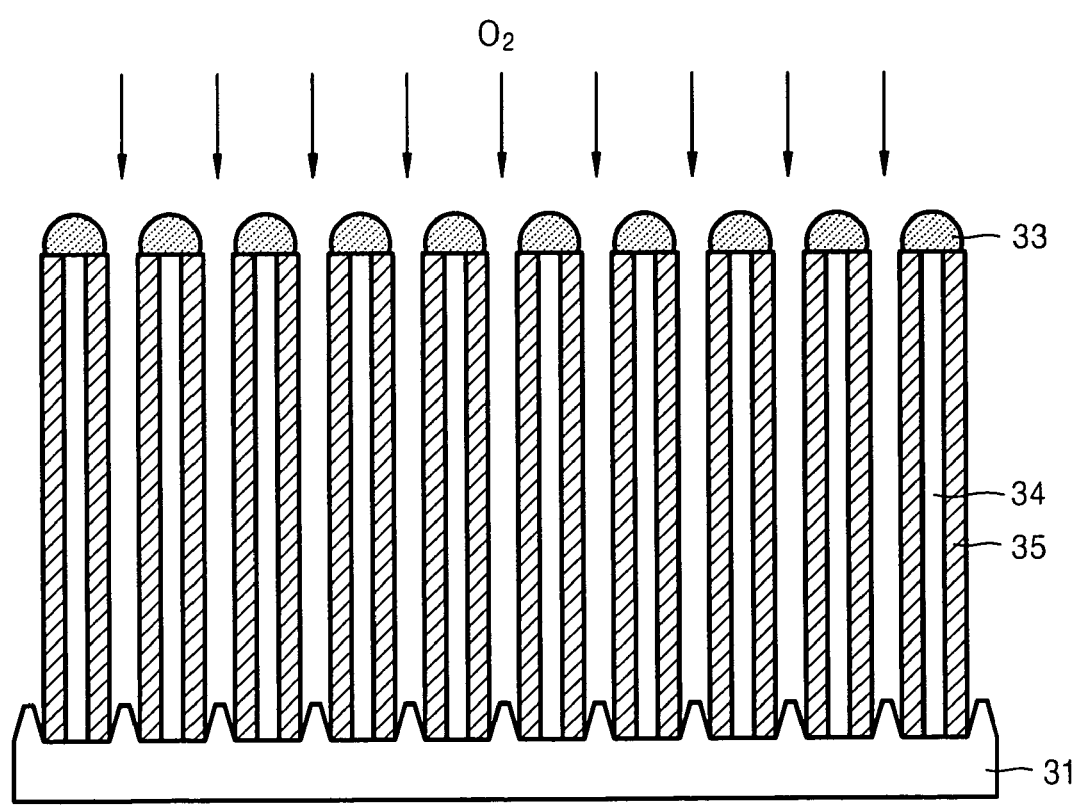
FIG. 3E is a cross-sectional view illustrating when an oxidation process is further performed to the nano wires manufactured through the method illustrated in FIGS. 3A through 3D to control diameters of the nano wires.

Referring to FIG. 3E, an oxidation process can be additionally performed to control the widths of the nano wires 34. That is, when the oxidation process is performed after the nano wires 34 are formed, the formation of silicon oxide layers 35 is accelerated, especially on sides of the nano wires 34, thereby enabling the controlling of the thickness of the nano wires 34.

According to the present disclosure, since nano wires are manufactured by forming the nano wires on a substrate in which microgrooves having microcavities are formed, the sizes and distribution of the microcavities being controlled, the widths and distribution of the nano wires are controlled according to the shapes and distribution of the microgrooves.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nano wire structure comprising:
   a silicon substrate having a surface where microgrooves having a plurality of microcavities are formed itself;
   nano wires formed on the substrate from each of the microgrooves; and
   a metal catalyst formed on one end of each of the nano wires.

2. The nano wires of claim 1, wherein the microgrooves having the microcavities are formed in a regular arrangement and distribution in the silicon substrate.

3. The nano wires of claim 1, further comprising oxide layers formed on sides of the nano wires.

4. The nano wires of claim 1, wherein the metal catalysts comprise at least one transition metal.

5. The nano wires of claim 4, wherein the metal catalysts comprise at least one transition metal selected from the group consisting, Au, Ti, Ni, and Fe.

* * * * *